(12) United States Patent
Munday et al.

(10) Patent No.: US 10,577,721 B2
(45) Date of Patent: Mar. 3, 2020

(54) HIGHLY FLUORESCENT DIAMOND PARTICLES AND METHODS OF FABRICATING THE SAME

(71) Applicant: Element Six (UK) Limited, Oxfordshire (GB)

(72) Inventors: Mark Gregory Munday, Oxfordshire (GB); Matthew Lee Markham, Oxfordshire (GB)

(73) Assignee: ELEMENT SIX ABRASIVES S.A., Luxembourg (LU)

(*) Notice: Subject to any disclaimer, the term of this patent is extended or adjusted under 35 U.S.C. 154(b) by 0 days.

(21) Appl. No.: 15/561,362

(22) PCT Filed: Mar. 23, 2016

(86) PCT No.: PCT/EP2016/056405
§ 371 (c)(1),
(2) Date: Sep. 25, 2017

(87) PCT Pub. No.: WO2016/151026
PCT Pub. Date: Sep. 29, 2016

(65) Prior Publication Data
US 2018/0080145 A1    Mar. 22, 2018

(30) Foreign Application Priority Data

Mar. 26, 2015 (GB) .................................. 1505139.4

(51) Int. Cl.
*C30B 33/02* (2006.01)
*C30B 33/04* (2006.01)
(Continued)

(52) U.S. Cl.
CPC .............. *C30B 33/04* (2013.01); *C01B 32/28* (2017.08); *C09K 11/65* (2013.01); *C30B 29/04* (2013.01); *C30B 29/60* (2013.01); *C30B 33/02* (2013.01)

(58) Field of Classification Search
CPC ... B01J 2203/0655; C30B 29/04; C30B 29/60
(Continued)

(56) References Cited

U.S. PATENT DOCUMENTS 4,273,561 A * 6/1981 Fernandez-Moran Villalobos ...... B01J 3/08
505/825
4,880,613 A * 11/1989 Satoh ..................... C30B 33/00
423/446

(Continued)

FOREIGN PATENT DOCUMENTS

DE    102014104551 A1    10/2015
EP    1522530 A1    4/2005
(Continued)

OTHER PUBLICATIONS

Han et al., Laser Thinning for Monolayer Graphene Formation: Heat Sink and Interference Effect, Amer. Chem. Soc. Nano, vol. 5, No. 1, 263-268, 2011 (Year: 2011).*
(Continued)

*Primary Examiner* — Hoa (Holly) Le
(74) *Attorney, Agent, or Firm* — Bryan Cave Leighton Paisner LLP (57) ABSTRACT

A method of fabricating fluorescent diamond particles, and diamond particles fabricated by the method. The method comprises mounting a diamond body on a heat sink, the diamond body comprising a plurality of diamond particles having a particle size of no more than 250 micrometres and bound together in the diamond body by a binder. The diamond body is irradiated to generate vacancy defects in
(Continued)

the diamond particles. The binder is then removed to separate the diamond body into diamond particles.

11 Claims, 3 Drawing Sheets

(51) Int. Cl.
    *C30B 29/04*     (2006.01)
    *C01B 32/28*     (2017.01)
    *C09K 11/65*     (2006.01)
    *C30B 29/60*     (2006.01)

(58) Field of Classification Search
    USPC .......................................... 216/52, 62, 81, 87
    See application file for complete search history.

(56) References Cited

U.S. PATENT DOCUMENTS

| | | | |
|---|---|---|---|
| 5,160,405 A | * | 11/1992 | Miyauchi ................ C30B 33/00 |
| | | | 204/192.32 |
| 8,932,554 B2 | | 1/2015 | Boudou et al. |
| 2009/0305031 A1 | | 12/2009 | Picardi et al. |
| 2010/0181534 A1 | | 7/2010 | Shenderova et al. |
| 2014/0065424 A1 | | 3/2014 | Boudou et al. |

FOREIGN PATENT DOCUMENTS

| | | |
|---|---|---|
| EP | 1990313 A1 | 11/2008 |
| GB | 2492822 A | 1/2013 |
| JP | 2012121765 | 6/2012 |
| WO | 2007/027655 A1 | 3/2007 |
| WO | 2011/069637 A1 | 6/2011 |

OTHER PUBLICATIONS

Beveratos et al, "Nonclassical radiation from diamond nanocrystals", Available online at http://arxiv.org/pdf/quantph/0104028.pdf, Oct. 31, 2001.

Rabeau et al, "Single Nitrogen Vacancy Centers in Chemical Vapor Deposited Diamond Nanocrystals", Nano Letters, Sep. 29, 2007, vol. 7, No. 11, pp. 3433-3437.

* cited by examiner

HIGHLY FLUORESCENT DIAMOND PARTICLES AND METHODS OF FABRICATING THE SAME

FIELD OF THE INVENTION

The present invention relates to highly fluorescent diamond particles and methods of fabricating such particles for use in applications such as fluorescent markers and labels in biological applications and medical diagnostics.

BACKGROUND

Many point defects have been studied in synthetic diamond material including: silicon containing defects such as silicon-vacancy defects (Si-V), silicon di-vacancy defects (Si-$V_2$), silicon-vacancy-hydrogen defects (Si-V:H), silicon di-vacancy hydrogen defects (S-$V_2$:H); nickel containing defect; chromium containing defects; and nitrogen containing defects such as nitrogen-vacancy defects (N-V), di-nitrogen vacancy defects (N-V-N), and nitrogen-vacancy-hydrogen defects (N-V-H). These defects are typically found in a neutral charge state or in a negative charge state.

Fluorescent point defects in synthetic diamond material have been proposed for use in various sensing, detecting, and quantum processing applications including: magnetometers; spin resonance devices such as nuclear magnetic resonance (NMR) and electron spin resonance (ESR) devices; spin resonance imaging devices for magnetic resonance imaging (MRI); and quantum information processing devices such as for quantum computing.

In addition to the above, it has also been proposed to use fluorescent point defects in diamond material as fluorescent markers or labels in biological applications and medical diagnostics. For example, Rabeau et al, (Nano Letters, vol. 7, No. 11, 3433-3437, 2007) disclose the use of nanodiamonds as fluorescent labels in biological systems. As indicated by Rabeau et al, key advantages of nanodiamonds compared to other conventional fluorescent biolabels include their noncytotoxicity, room-temperature photostability, and the relative ease with which surfaces can be functionalized. It is further indicated that biological applications demand bright fluorescence from small crystals. In this regard, Rabeau et al. have performed an analysis of diamond particle size versus nitrogen-vacancy (NV) centre content and found a strong dependence of NV centre content and crystal size for diamond nano-crystals grown via a chemical vapour deposition technique. They report that a particle size of 60-70 nm is optimal for single NV centre incorporation per diamond nano-particle.

One problem with the diamond nano-particles described by Rabeau is that they have a low NV centre content and thus have a relatively low fluorescent intensity which is not ideal for many fluorescent marker applications. The Rabeau et al. document itself indicates that biological applications demand bright fluorescence from small crystals. However, there is no indication of how to incorporate a high concentration of NV centres into small diamond nano-crystals to increase their fluorescent intensity. The diamond nano-crystals described in the Rabeau et al, document have a low NV centre content and thus will have a relatively low fluorescent intensity not suited to many fluorescent marker applications.

US2014/0065424 (granted as U.S. Pat. No. 8,932,554) also discloses a method of producing light-emitting nano-particles of diamond. In the method described in this document micrometre scale diamond particles are irradiated and annealed and then the particles are ground to nano-particles having a size between 15 and 20 nanometres.

It is an aim of embodiments of the present invention to provide small diamond particles which have a high concentration of fluorescent point defects and thus a high fluorescent intensity. It is also an aim of embodiments of the present invention to provide suitable fabrication methods for achieving such highly fluorescent diamond particles.

SUMMARY

According to a first aspect, there is provided a method of fabricating fluorescent diamond particles. The method comprises mounting a diamond body on a heat sink, the diamond body comprising a plurality of diamond particles having a particle size of no more than 250 micrometres and bound together in the diamond body by a binder. The diamond body is irradiated to generate vacancy defects in the diamond particles. The binder is then removed to separate the diamond body into diamond particles.

As an option, the binder comprises an organic polymer.

As an option, the diamond body is in the form of a sheet of diamond paper.

The diamond body optionally has a thickness of no more than: 3 mm; 2 mm; 1 mm; 500 micrometres; 250 microns; or 100 microns.

The particle size of the diamond particles is optionally selected from any one of no more than: 100 micrometres; 1 micrometre; 500 nanometres; or 200 nanometres. The particle size of the diamond particles is optionally selected from any one of no less than: 10 nanometres; 20 nanometres; 30 nanometres; or 40 nanometres. The diamond particles optionally have a size distribution selected from any one of no more than: 10 micrometres; 1 micrometre; 500 nanometres; 200 nanometres; 100 nanometres; 50 nanometres; or 10 nanometres.

As an option, the diamond particles have a nitrogen or silicon concentration selected from any one of at least: 10 ppm; 20 ppm; 50 ppm; 100 ppm; or 200 ppm. As an option, the diamond particles have a nitrogen or silicon concentration selected from any one of no more than: 500 ppm; 400 ppm; 300; or 200 ppm.

As an option, a plurality of the diamond bodies are mounted on the heat sink and irradiated.

The irradiating is optionally performed at a temperature selected from any one of no more than: 500° C.; 400° C.; 300° C.; 200° C.; 100° C.; or 50° C.

The irradiating step is optionally controlled to introduce isolated vacancy point defects into the diamond particles at a concentration selected from any one of at least: 10 ppm; 20 ppm; 50 ppm; 100 ppm; or 200 ppm. As an option, the irradiating step is controlled to introduce isolated vacancy point defects into the diamond particles at a concentration selected from any one of no more than: 500 ppm; 400 ppm; 300; or 200 ppm.

Optionally, after irradiating, the diamond body is annealed. The annealing step is optionally performed at a temperature selected from any one of at least: 600° C.; 700° C.; or 750° C. The annealing step is optionally performed at a temperature selected from any one of no more than: 1000° C.; 900° C.; 850° C.; or 800° C. Optionally, after the irradiating and annealing steps the diamond particles have an impurity-vacancy point defect concentration selected from any one of at least: 5 ppm; 10 ppm; 20 ppm; 50 ppm; or 100 ppm. As an option, after the irradiating and annealing steps the impurity-vacancy point defect concentration is selected from any one of no more than: 500 ppm; 400 ppm;

300; or 200 ppm. The impurity-vacancy point defects are optionally nitrogen-vacancy point defects or silicon-vacancy point defects.

As an option, the separating step is achieved via a mechanical, chemical, or thermal separation technique.

According to a second aspect, there is provided a diamond body comprising a plurality of diamond particles having a particle size of no more than 250 micrometres, and bound together in the diamond body by a binder. The diamond particles have a vacancy or impurity-vacancy point defect concentration of at least 5 ppm. Such a diamond body can be fabricated via the method of the first aspect of the invention.

As an option, the binder comprises an organic polymer.

The diamond body is optionally in the form of a sheet of diamond paper.

As an option, the diamond body has a thickness selected from any one of no more than: 3 mm; 2 mm; 1 mm; 500 micrometres; 250 microns; or 100 microns.

The particle size of the diamond particles is optionally selected from any one of no more than: 100 micrometres; 1 micrometre; 500 nanometres; or 200 nanometres. The particle size of the diamond particles is optionally selected from any one of no less than: 10 nanometres; 20 nanometres; 30 nanometres; or 40 nanometres. The diamond particles optionally have a size distribution selected from any one of no more than: 10 micrometres; 1 micrometre; 500 nanometres; 200 nanometres; 100 nanometres; 50 nanometres; or 10 nanometres.

As an option, the vacancy or impurity-vacancy point defect concentration is selected from any one of at least: 10 ppm; 20 ppm; 50 ppm; or 100 ppm. As an option, the vacancy or impurity-vacancy point defect concentration is selected from any one of no more than: 500 ppm; 400 ppm; 300; or 200 ppm.

As an option, the impurity-vacancy point defects are nitrogen-vacancy point defects or silicon-vacancy point defects.

As an option, a variation in the vacancy or impurity-vacancy point defect concentration between diamond particles is selected from any one of no more than: 50%; 40%; 30%; 20% or 10%.

The diamond body optionally has a three point bend strength selected from any one of below 50 MPa, 10 MPa, 1 MPa, 500 Pa, or 100 Pa. The diamond body optionally has a three point bend strength selected from any one of above 1 Pa, 5 Pa, 10, Pa, or 50 Pa.

According to a third aspect, there is provided a diamond powder comprising diamond particles have a particle size less than 1 micrometre and a vacancy or impurity-vacancy point defect concentration of at least 5 ppm. Such a diamond powder can be fabricated by separating the diamond particles from the diamond body provided in the second aspect of the invention.

The vacancy or impurity-vacancy point defect concentration is optionally selected from any one of at least: 10 ppm; 20 ppm; 50 ppm; or 100 ppm. The vacancy or impurity-vacancy point defect concentration is optionally selected from any one of no more than: 500 ppm; 400 ppm; 300; or 200 ppm.

The impurity-vacancy point defects are optionally nitrogen-vacancy point defects or silicon-vacancy point defects.

The particle size of the diamond particles is optionally no more than 500 nanometres or 200 nanometres. The particle size of the diamond particles is optionally selected from any one of no less than: 10 nanometres; 20 nanometres; 30 nanometres; or 40 nanometres.

The diamond particles optionally have a size distribution selected from any one of no more than: 10 micrometres; 1 micrometre; 500 nanometres; 200 nanometres; 100 nanometres; 50 nanometres; or 10 nanometres.

As an option, a variation in the vacancy or impurity-vacancy point defect concentration between diamond particles is selected from any one of no more than: 50%; 40%; 30%; 20% or 10%.

The diamond powder optionally further comprising one or more organic functional groups bonded to an outer surface of the diamond particles.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

It is known that NV centre concentration can be increased by irradiating and annealing nitrogen-containing diamond material. Irradiating diamond material, e.g. with electrons or neutrons, introduces vacancy defects into the diamond lattice by knocking carbon atoms off their lattice sites. If the diamond material is then annealed, e.g. at a temperature around 800° C., than the vacancies migrate through the diamond lattice and pair up with single substitutional nitrogen defects to form NV centres.

In light of the above, the obvious solution to increase the NV centre content of small diamond particles would be to irradiate and anneal the particles. Indeed, the Rabeau et al. document discussed in the background section of this specification suggests that diamond nano-powder can be electron-irradiated although only in the context of introducing a low NV centre content. However, several problems exist when irradiating diamond nano-particles including:

(i) Handling Issues—nano-particles can be difficult and hazardous to handle.

(ii) Uniformity Issues—following on from the above, nano-powders can be difficult to distribute evenly over a mounting in an irradiation apparatus to obtain a uniformly irradiated powder.

(iii) Thermal Management a. Due to the large surface to volume ratio of diamond nano-powders they can readily graphitize during irradiation.

b. Due to the large surface to volume ratio of diamond nano-powders vacancies generated by irradiation can readily anneal out of the particles during the irradiation process and/or re-combine with interstitial carbon atoms.

In light of the above, it is difficult to irradiate diamond nano-particles with a sufficient dosage of radiation to introduce a relative large concentration of vacancy defects in order to significantly increase the NV centre content of the material. In order to alleviate thermal management issues, the nano-particles can be mounted on a cooling block. However, while this approach is adequate for larger diamond particles with a smaller surface to volume ratio, for very small nano-scale diamond particles with a very large surface to volume ratio the particles can still be graphitized and/or subject to vacancy anneal-out and/or re-combine with interstitial carbon atoms even when mounted on a cooling block if subjected to a large dose of high energy irradiation. Furthermore, handling and uniformity issues still remain.

One solution to this problem is to irradiate larger diamond particles on a cooling block, anneal the irradiated diamond particles to form a high concentration of NV centres, and then crush the diamond particles to reduce their size in order to form a diamond nano-powder with a high NV content. Such a fabrication method is described in US2014/0065424 discussed in the background section of this specification. This fabrication route is viable but not optimal. The reason why this fabrication route is not optimal is that many applications require diamond particles which lie within a relatively tight particle size distribution and/or a relatively uniform fluorescent intensity. However, a crushing process performed after irradiation and annealing will yield a relatively large particle size distribution and also a relatively large variation in fluorescent intensity. As such, further processing is required to separate out particles of the desired size and much of the diamond material which has been subjected to the irradiation and annealing treatment must be discarded. Accordingly, the fabrication process has a relatively low yield for a diamond nano-powder product which has a relatively tight particle size distribution and a relatively uniform, high fluorescent intensity. Furthermore, since the expense of the irradiation process is not trivial, discarding material after treatment is not desirable.

A preferred solution would be to ensure that the diamond powder has the desired particle size distribution prior to subjecting the material to irradiation and annealing such that the treated material does not require further crushing and particle size-filtering steps. However, as previously indicated, irradiation of diamond nano-particles with a sufficient dosage of irradiation to form very bright, high NV content diamond nano-particles can cause thermal management issues such as graphitization of the diamond nano-particles and/or annealing out of vacancies during the irradiation treatment. Furthermore, handling loose diamond nano-powder during irradiation and annealing treatments can be difficult and hazardous and also subject to problems of achieving uniformity.

It has now been found that irradiation of diamond nano-particles with a sufficient dosage of irradiation to form very bright, high NV content diamond nano-particles can be achieved while avoiding the aforementioned thermal management and handling issues by providing the diamond nano-particles in the form of a diamond body in which the diamond nano-particles are loosely bound together. By providing a diamond body in which the diamond nano-particles are only loosely bound, the diamond nano-particles can be separated after the irradiation and annealing treatment without requiring a high degree of force which would otherwise result in fracturing of the diamond particles thus altering the size distribution of the diamond nano-particles. Furthermore, by providing the diamond nano-particles in the form of a loosely bound diamond body, the exposed surface area of the diamond nano-particles is reduced therefore reducing the possibility of graphitization. Further still, by providing the diamond nano-particles in the form of a loosely bound diamond body, heat generated during irradiation is spread over the diamond particles due to the high thermal conductivity of the diamond particles thus avoiding localized heating and graphitization and/or vacancy annealing issues.

The diamond body can thus be loosely bound for easy of diamond particle separation, for example, with a three point bend strength below 50 MPa, 10 MPa, 1 MPa, 500 Pa, or 100 Pa. Furthermore, for many applications the diamond body should be readily handleable without break-up, e.g. for ease of processing during fabrication or for post-fabrication distribution. In such applications, the diamond body may have a three point bend strength of above, for example, 1 Pa, 5 Pa, 10, Pa, or 50 Pa. The exact strength will depend on the type of bonding utilized, the application requirements in terms of handleability, and also the manner in which the diamond particles are to be separated, e.g. chemical versus mechanical break-up.

Figure 1:
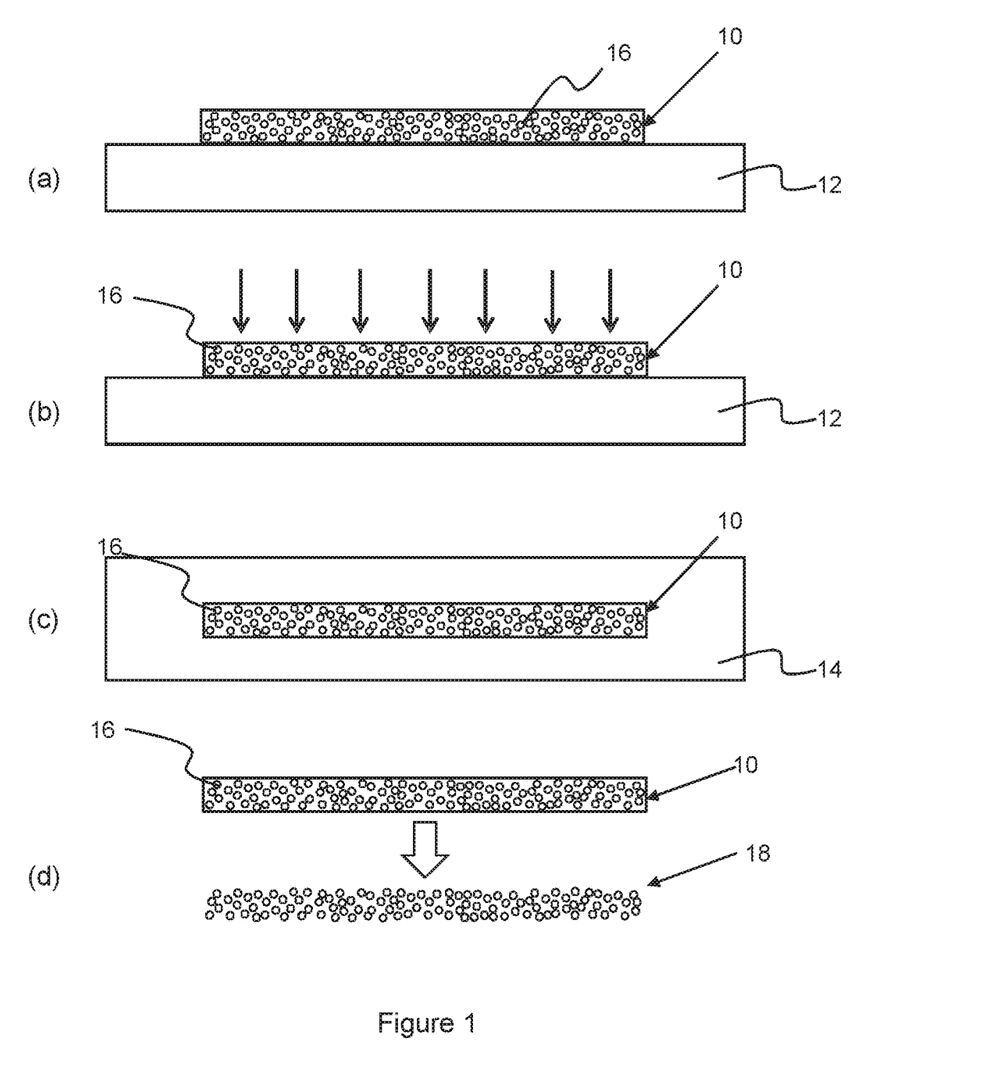
FIGS. 1(a) to 1(d) illustrate the steps involved in a method of fabricating highly fluorescent diamond particles according to an embodiment of the present invention.

FIG. 1 illustrates the steps involved in a method of fabricating highly fluorescent diamond particles according to an embodiment of the present invention. The method comprises:
(a) mounting a diamond body 10 on a heat sink 12;
(b) irradiating the diamond body 10 on the heat sink 12; and
(c) annealing the diamond body 10, e.g. in a sealed vessel 14 under vacuum or an inert atmosphere such that the diamond body 10 is not graphitized;
wherein the diamond body 10 comprises a plurality of diamond particles 16 having a particle size of no more than 250 micrometres, and
wherein the diamond particles 16 are loosely bound together such that the diamond particles 16 can be separated after irradiating and annealing without damaging the diamond particles 16.

After irradiation and annealing the diamond particles can be separated from the diamond body 10 without damaging the diamond particles to yield a diamond powder 18 as illustrated in FIG. 1(d). The separating step may be achieved via a mechanical, chemical, or thermal separation technique with the preferred technique dependent on the particular way that the diamond particles are bound together in the diamond body. While the separation step can be performed by the manufacturer prior to sale of the irradiated and annealed diamond material, another approach is to sell the irradiated and annealed diamond body without separating the diamond particles such that customers can separate and use the diamond particles as required. An advantage to this approach is that the diamond body can be more easily handled than free diamond powder and thus in some instances it may be preferred to sell the irradiated and annealed diamond body without separating the diamond particles into free powder form.

The loosely bound diamond body comprises a binder, e.g. an organic polymer, in order to bind the diamond nano-particles together. For comparison, the diamond body may be formed merely by compacting the diamond nano-particles together without any binder. In this regard, it will be appreciated that any compacting process must not impart sufficient force that the nano-particles are crushed thus significantly altering their size distribution. Furthermore, any compacting process must not lead to intergrowth of the diamond particles thus forming strong diamond-to-diamond bonding which would require crushing forces to break up the diamond body. Similarly, conventional metal binders which are utilized to form inter-grown polycrystalline diamond bodies under high pressure high temperature conditions should not be used as again this will result in strong diamond-to-diamond bonding which would require crushing forces to break up the diamond body.

Figure 2:
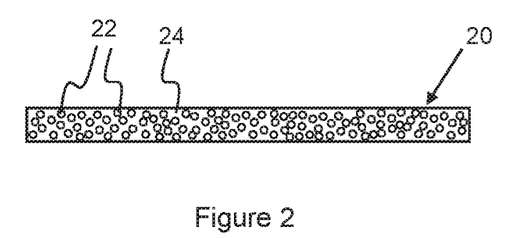
FIG. 2 illustrates an example of a loosely bound diamond body in the form of diamond particles bound together by an organic polymer to form diamond paper.

FIG. 2 illustrates one example of a suitable loosely bound diamond body in the form of diamond paper 20 comprising diamond particles 22 bonded together by an organic polymer such as a methylcellulose binder 24. However, a skilled person will appreciate that other binders may be utilized so long as the diamond particles can be separated after irradiation and annealing via mechanical, chemical, or thermal means without damaging the diamond particles by removing the binder. Note that inorganic binders may be used provided they can be easily separated from the diamond particles without causing significant damage to the diamond particles.

Figure 3:
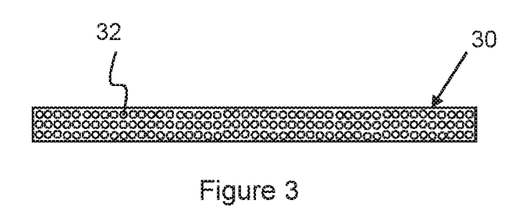
FIG. 3 illustrates an example of a loosely bound diamond body in the form of a binderless, compacted free-standing wafer of diamond particles.
Figure 4:
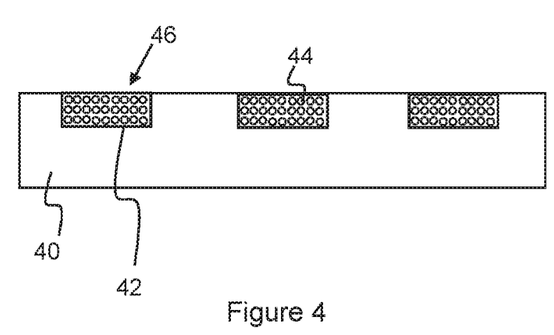
FIG. 4 illustrates another example comprising a holder with one or more shallow pockets or indentations into which diamond powder is packed to form one or more loosely bound diamond bodies.

Having regard to options for binderless approaches, one option is to form a compacted free-standing wafer 30 of diamond particles 32 as illustrated in FIG. 3, which is formed by pressing the particles together with sufficient force for them to stick together but not so much force that the particles are crushed or form strong diamond-diamond bonds between the particles. An alternative approach as illustrated in FIG. 4 is to provide a holder 40 with one or more shallow pockets or indentations 42 into which diamond powder 44 is packed to form one or more diamond bodies 46. Advantageously the holder is selected to have a high thermal conductivity. For example, a metal plate may be formed with a series of shallow pockets into which diamond powder can be packed to form an array of loosely bound diamond bodies. The thermally conductive holder can then be mounted onto a heat sink and subjected to irradiation.

A plurality of the diamond bodies can be mounted on a heat sink and irradiated in a single irradiation step. In order to ensure that the diamond particles are subjected to a relatively uniform dose of irradiation each diamond body should preferably have a thickness of no more than: 3 mm; 2 mm; 1 mm; 500 micrometres; 250 microns; or 100 microns. If the diamond body is made too thick then diamond particles located within the body or at a lower surface of the diamond body can be subjected to less radiation then diamond particles at or near the upper surface of the diamond body when irradiated from a top side. Furthermore, by providing a relatively thin diamond body then heat generated within the diamond body during irradiation can be efficiently transferred into the heat sink.

The size of the diamond particles used to form the diamond body will be selected according to the intended end use. The advantage of the fabrication method as described herein is that the desired particle size can be pre-selected and then preserved during the treatment steps to ensure that yield of final product falling within a required specification are extremely high, even when very tight size and nitrogen-vacancy concentration product specifications are applied. The present methodology is particularly advantageous for very small nano-scale diamond powders. However, it is also envisaged that the presently described fabrication technique could also be applied to larger micrometre scale diamond particles. For example, the particle size of the diamond particles may be no more than 100 micrometres, 1 micrometre, 500 nanometres, or 200 nanometres and/or no less than 10 nanometres, 20 nanometres, 30 nanometres, or 40 nanometres and/or within a range defined by any of the aforementioned upper and lower values.

Because the particle size can be pre-selected and then preserved during the treatment steps it is possible to achieve a tight size distribution without discarding any of the irradiated and anneal diamond particles. For example, the diamond particles may have a size distribution of no more than: 10 micrometres; 1 micrometre; 500 nanometres; 200 nanometres; 100 nanometres; 50 nanometres; or 10 nanometres.

To achieve highly fluorescent diamond particles have a high nitrogen-vacancy content, the starting material should be selected to have a high nitrogen content. For example, the diamond particles may have a nitrogen concentration of at least 10 ppm, 20 ppm, 50 ppm, 100 ppm, or 200 ppm and/or a nitrogen concentration of no more than 500 ppm, 400 ppm, 300, or 200 ppm and/or within a range defined by any of the aforementioned upper and lower values.

Furthermore, to achieve highly fluorescent diamond particles have a high nitrogen-vacancy content, the irradiation step should be controlled to introduce a large concentration of isolated vacancy point defects into the diamond material. For example, the irradiating step may be controlled to introduce isolated vacancy point defects into the diamond particles at a concentration of at least 10 ppm, 20 ppm, 50 ppm, 100 ppm, or 200 ppm and/or a concentration of no more than 500 ppm, 400 ppm, 300, or 200 ppm and/or within a range defined by any of the aforementioned upper and lower values. By forming a loosely bound diamond body the exposed surface area of the diamond particles is reduced and heat spreading is improved thus reducing thermal management problems such as graphitization and vacancy anneal-out even at very high irradiation levels required to introduce very high vacancy concentrations. The irradiation may be via electrons, neutrons, ion bombardment; or gamma rays with electron irradiation being preferred for certain applications. In addition, the use of a heat sink on which the diamond body is placed allows the temperature to be controlled. For example, the irradiating may be performed at a temperature of no more than 500° C., 400° C., 300° C., 200° C., 100° C. or 50° C. The diamond body may be merely placed on the heat sink. Alternatively, a thermal contact fluid, paste, or bonding may be used to control the thermal contact between the diamond body and the underlying heat sink.

After irradiating the diamond body can be subjected to an annealing treatment at a temperature suitable to cause migration of vacancy defects through the diamond lattice and formation of nitrogen-vacancy defects. Such an annealing step may be performed at a temperature of at least 600° C., 700° C., or 750° C. and/or at a temperature of no more than 1000° C., 900° C., 850° C., or 800° C. and/or within a range defined by any of the aforementioned upper and lower values. The annealing step may be performed under vacuum or under an inert atmosphere to prevent graphitization of the diamond material during the annealing process.

The use of a loosely bound diamond body as described herein in combination with a large dose of radiation and subsequent annealing allows the fabrication of diamond particles have a very high nitrogen-vacancy concentration. For example, after the irradiating and annealing steps the diamond particles may have a nitrogen-vacancy concentration of at least 5 ppm, 10 ppm, 20 ppm, 50 ppm, or 100 ppm and/or a nitrogen-vacancy concentration of no more than 500 ppm, 400 ppm, 300, or 200 ppm and/or within a range defined by any of the aforementioned upper and lower values.

While the methodology has been described above in relation to the formation of fluorescent nitrogen-vacancy point defects, it is also envisaged that the fluorescent defects may be formed by the vacancy defects themselves or by other impurity-vacancy defects such as silicon-vacancy defects. Where vacancy defects are utilized as the active functional defect no annealing step is required after irradiation. For other impurity-vacancy defects such as silicon-vacancy defects an irradiation treatment followed by an annealing treatment can be applied in a similar manner to the nitrogen-vacancy based fluorescent diamond particles as described previously.

Utilizing the methodology as described, a diamond body can be provided which comprises:
a plurality of diamond particles having a particle size of no more than 250 micrometres.
wherein the diamond particles are loosely bound together such that the diamond particles can be separated without damaging the diamond particles, and
wherein the diamond particles have a vacancy or impurity-vacancy point defect concentration of at least 5 ppm.

Figure 5:
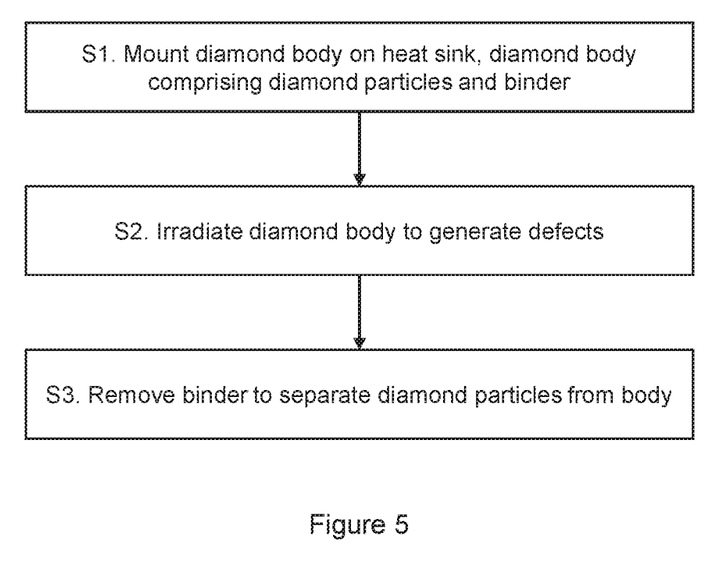
FIG. 5 is a flow diagram showing exemplary method steps.

FIG. 5 is a flow diagram showing exemplary steps for fabricating fluorescent diamonds. The following numbering corresponds to that of FIG. 5:

S1. A diamond body is mounted on a heat sink. The diamond body comprises a plurality of diamond particles having a particle size of no more than 250 micrometres and bound together in the diamond body by a binder (such as an organic polymer).

S2. The diamond body is irradiated to generate vacancy defects in the diamond particles; and S3. The binder is removed from the diamond body to separate the diamond particles from the diamond body without causing significant damage to the diamond particles.

The diamond body is loosely bound for easy of diamond particle separation, for example, with a three point bend strength below 50 MPa, 10 MPa, 1 MPa, 500 Pa, or 100 Pa. Furthermore, for many applications the diamond body should be readily handleable without break-up, e.g. for ease of processing during fabrication or for post-fabrication distribution. In such applications, the diamond body may have a three point bend strength of above, for example, 1 Pa, 5 Pa, 10, Pa, or 50 Pa. The exact strength will depend on the type of bonding utilized, the application requirements in terms of handleability, and also the manner in which the diamond particles are to be separated, e.g. chemical versus mechanical break-up.

The plurality of diamond particles may be bound together in the diamond body by a binder, such as an organic polymer, and may be in the form of a sheet of diamond paper. Alternatively, the plurality of diamond particles can be bound together in the diamond body without a binder such as in a free-standing compacted body of diamond particles. Such a compacted diamond body should not comprise inter-grown diamond particles but can be formed in a high pressure high temperature press without any binder and at a pressure and temperature which does not caused diamond intergrowth. Alternatively still, the diamond body may be provided in the form of compacted diamond particles disposed in one or more indentation within a holder.

The diamond body may have a thickness of no more than: 3 mm; 2 mm; 1 mm; 500 micrometres; 250 microns; or 100 microns. If in free standing form, the diamond body will generally have a thickness of at least 50 microns. Furthermore, the diamond body may comprise particles having a size of no more than 100 micrometres, 1 micrometre, 500 nanometres, or 200 nanometres and/or no less than 10 nanometres, 20 nanometres, 30 nanometres, or 40 nanometres and/or any combination of the aforementioned upper and lower limits.

Further still, the diamond body may comprise particles having a uniform size distribution and a relative high and uniform point defect concentration. For example, the diamond particle size distribution may be no more than: 10 micrometres; 1 micrometre; 500 nanometres; 200 nanometres; 100 nanometres; 50 nanometres; or 10 nanometres. Furthermore, the vacancy or impurity-vacancy point defect concentration may be at least 10 ppm, 20 ppm, 50 ppm, or 100 ppm and/or no more than 500 ppm, 400 ppm, 300, or 200 ppm and/or any combination of the aforementioned upper and lower limits. A variation in the vacancy or impurity-vacancy point defect concentration between diamond particles can be no more than: 50%; 40%; 30%; 20% or 10%.

The diamond body as described above can be readily separated into individual particles to form a diamond powder. A diamond nano-powder can thus be formed which comprises highly fluorescent particles and also highly uniform particle size and fluorescent intensity. Typically, the diamond powder comprises diamond particles having a particle size no more than 1 micrometre, 500 nanometres or 200 nanometres and a nitrogen-vacancy concentration of at least 5 ppm, 10 ppm, 20 ppm, 50 ppm, or 100 ppm. The diamond powder may comprise one or more of the following characteristics:
 a particle size no less than 10 nanometres, 20 nanometres, 30 nanometres, or 40 nanometres;
 a particle size distribution of no more than 10 micrometres, 1 micrometre, 500 nanometres, 200 nanometres, 100 nanometres, 50 nanometres, or 10 nanometres;
a nitrogen-vacancy concentration of no more than 500 ppm, 400 ppm, 300, or 200 ppm;
 a variation in nitrogen-vacancy concentration between diamond particles of no more than 50%, 40%, 30%, 20%; or 10%;
 one or more organic functional groups bonded to an outer surface of the diamond particles.

While this invention has been particularly shown and described with reference to embodiments, it will be understood to those skilled in the art that various changes in form and detail may be made without departing from the scope of the invention as defined by the appending claims. For example, while the present invention has been described in the context of fluorescent marker applications, certain embodiments may also be utilized in other applications including quantum sensing applications such as diamond-based magnetometry.

The invention claimed is:

1. A method of fabricating fluorescent diamond particles, the method comprising:
    mounting a diamond body on a heat sink, the diamond body comprising a plurality of diamond particles having a particle size of no more than 250 micrometres and bound together in the diamond body by an organic polymer binder;
    irradiating the diamond body to generate vacancy defects in the diamond particles; and
    removing the binder to separate the diamond body into diamond particles.

2. The method according to claim 1, wherein the diamond body has a thickness of no more than: 3 mm; 2 mm; 1 mm; 500 micrometres; 250 microns; or 100 microns.

3. The method according to claim 1, wherein the particle size of the diamond particles is selected from any one of no more than: 100 micrometres; 1 micrometre; 500 nanometres; or 200 nanometres.

4. The method according to claim 1, wherein the particle size of the diamond particles is selected from any one of no less than: 10 nanometres; 20 nanometres; 30 nanometres; or 40 nanometres.

5. The method according to claim 1, wherein the diamond particles have a size distribution selected from any one of no more than: 10 micrometres; 1 micrometre; 500 nanometres; 200 nanometres; 100 nanometres; 50 nanometres; or 10 nanometres.

6. The method according to claim 1, wherein the diamond particles have a nitrogen or silicon concentration selected from any one of at least: 10 ppm; 20 ppm; 50 ppm; 100 ppm; or 200 ppm; and any one of no more than 500 ppm; 400 ppm; 300; or 200 ppm.

7. The method according to claim 1, wherein the irradiating is performed at a temperature selected from any one of no more than: 500° C.; 400° C.; 300° C.; 200° C.; 100° C.; and 50° C.

8. The method according to claim 1, wherein the irradiating step is controlled to introduce isolated vacancy point defects into the diamond particles at a concentration selected from any one of at least: 10 ppm; 20 ppm; 50 ppm; 100 ppm; or 200 ppm; and any one of no more than: 500 ppm; 400 ppm; 300; or 200 ppm.

9. The method according to claim 1, wherein, after irradiating, the diamond body is annealed.

10. The method according to claim 9, wherein the annealing step is performed at a temperature selected from any one of at least: 600° C.; 700° C.; or 750° C.; and from any one of no more than: 1000° C.; 900° C.; 850° C.; or 800° C.

11. A method according to claim 1, wherein the separating step is achieved via a mechanical, chemical, or thermal separation technique.

* * * * *